United States Patent [19]

Moore

[11] Patent Number: 5,450,617
[45] Date of Patent: Sep. 12, 1995

[54] METHOD AND APPARATUS FOR CLOSED LOOP FREQUENCY CONTROL IN A TWO-WAY COMMUNICATION SYSTEM

[75] Inventor: Morris A. Moore, Wellington, Fla.

[73] Assignee: Motorola, Inc., Schaumburg, Ill.

[21] Appl. No.: 66,643

[22] Filed: May 25, 1993

[51] Int. Cl.$^6$ ............................................. H04B 1/38
[52] U.S. Cl. ........................................ 455/71; 455/70; 455/127; 455/88; 455/54.2; 455/67.1
[58] Field of Search ................. 455/54.1, 54.2, 67.1, 455/68, 69, 70, 71, 76, 127, 88, 186.1, 62, 56.1, 38.3

[56] References Cited

U.S. PATENT DOCUMENTS

| | | | |
|---|---|---|---|
| 4,401,860 | 8/1983 | Walls | 455/67.1 |
| 4,471,328 | 9/1984 | Chapman . | |
| 4,777,653 | 10/1988 | Bonnerot et al. | 455/69 |
| 4,823,123 | 4/1989 | Siwiak . | |
| 4,825,193 | 4/1989 | Siwiak et al. . | |
| 4,875,038 | 10/1989 | Siwiak et al. . | |
| 4,891,637 | 1/1990 | Siwiak et al. . | |
| 5,093,840 | 3/1992 | Schilling | 455/33.1 |
| 5,109,544 | 4/1992 | Mittel et al. . | |
| 5,124,697 | 6/1992 | Moore . | |
| 5,153,582 | 10/1992 | Davis . | |
| 5,249,305 | 9/1993 | Wieczorek et al. | 455/76 |

FOREIGN PATENT DOCUMENTS 0290321  11/1989  Japan ........................ 455/71

Primary Examiner—Edward F. Urban
Assistant Examiner—Doris To
Attorney, Agent, or Firm—R. Louis Breeden

[57] ABSTRACT

A method and apparatus for closed loop frequency control in a two-way radio communication system (100) include a base communication unit (104) and a portable communication unit (108) having a portable-to-base initiation channel (202) assigned to a predetermined frequency. A signal is transmitted (502) from the portable communication unit (108) to the base communication unit (104) on an initiation frequency of approximately the predetermined frequency. The base communication unit (104) determines (506) from the signal a frequency correction factor (326) for recalibrating the initiation frequency in accordance with the predetermined frequency. The frequency correction factor (326) is communicated (512) to the portable communication unit (108), and the portable communication unit (108) recalibrates (516) the initiation frequency in response.

16 Claims, 6 Drawing Sheets

METHOD AND APPARATUS FOR CLOSED LOOP FREQUENCY CONTROL IN A TWO-WAY COMMUNICATION SYSTEM

FIELD OF THE INVENTION

This invention relates in general to radio communication systems, and more specifically to a method and apparatus for closed loop frequency control in a two-way radio communication system.

BACKGROUND OF THE INVENTION

Two-way radio communication systems are well known. Examples include cellular telephone systems and trunked mobile radiotelephone systems. Such systems typically have utilized equal transmission bandwidths and substantially similar output power levels in both directions of transmission (portable-to-base and base-to-portable). Recently, asymmetrical two-way radio communication systems have come into existence. Asymmetrical systems do not use equal bandwidths or equal output power levels in both directions of transmission. Typically, asymmetrical systems use high power and high bandwidth in the base-to-portable direction, while using low bandwidth and low power in the portable-to-base direction. High bandwidth in the base-to-portable direction provides high data capacity in the base-to-portable direction, which is required, for example, in a high capacity selective call system.

Low bandwidth in the portable-to-base direction is advantageous in systems having battery powered portable units, which require low power operation to achieve long battery life. Low bandwidth is used to extend the transmission range of a low power transmitter to match the range of the high power base-to-portable direction. Low bandwidth necessarily implies low data capacity per channel, which in turn can necessitate multiple channels, e.g., the use of Frequency Division Multiple Access (FDMA), in the portable-to-base direction to increase capacity by allowing multiple users to communicate simultaneously on multiple narrowband channels.

Multiple narrowband channels can operate successfully only if the carrier frequencies of the narrowband channels can be controlled accurately enough to prevent overlap and resultant co-channel interference. Accurate frequency control could of course be accomplished by utilizing precision oscillators, but such oscillators would increase the cost, size, and power consumption of the portable unit, thereby substantially defeating the advantages of using the narrowband channels in the first place.

Thus, what is needed is a method and apparatus for controlling the carrier frequency of a narrowband portable-to-base channel without requiring precision oscillators. A reliable method and apparatus are needed that do not substantially increase the size, cost, or power consumption of the portable unit.

SUMMARY OF THE INVENTION

An aspect of the present invention is a method of closed loop frequency control in a two-way radio communication system including a base communication unit and a portable communication unit and having a portable-to-base initiation channel assigned to a predetermined frequency. The method comprises the steps of transmitting on the portable-to-base initiation channel a signal from the portable communication unit to the base communication unit, the signal having a predetermined output power and operating on an initiation frequency of approximately the predetermined frequency; and receiving the signal in the base communication unit. The method further comprises the steps of determining a frequency correction factor by performing a frequency measurement on the signal received in the base communication unit, the frequency correction factor for recalibrating the initiation frequency in accordance with the predetermined frequency; and communicating the determined frequency correction factor from the base communication unit to the portable communication unit on a base-to-portable channel different from the portable-to-base initiation channel. The method further comprises the step of recalibrating the initiation frequency in the portable communication unit in response to the communicated frequency correction factor by modulating a reference frequency that determines the initiation frequency, the modulating performed in accordance with the frequency correction factor communicated. The two-way radio communication system has a portable-to-base data channel assigned to a carrier frequency having a designated offset from the predetermined frequency assigned to the portable-to-base initiation channel. The method also includes the step of generating in the portable communication unit the carrier frequency of the portable-to-base data channel subsequent to the recalibrating step by applying the designated offset to the recalibrated initiation frequency in accordance with a data channel allocation instruction communicated from the base communication unit on the base-to-portable channel.

Another aspect of the present invention is a base communication unit for performing closed loop frequency control in a two-way radio communication system including the base communication unit and a portable communication unit having a portable frequency reference and utilizing a portable-to-base initiation channel assigned to a predetermined frequency. The base communication unit comprises a receiver for receiving an initiation signal from the portable communication unit on the portable-to-base initiation channel, the initiation signal having a predetermined output power and operating on an initiation frequency of approximately the predetermined frequency; and a controller coupled to the receiver for determining from the initiation signal a frequency correction factor for recalibrating the initiation frequency, the frequency correction factor determined from a frequency measurement on the initiation signal received. The base communication unit further comprises a transmitter coupled to the controller for communicating the frequency correction factor to the portable communication unit on a base-to-portable channel different from the portable-to-base initiation channel; and a signal processor coupled to the receiver and coupled to the controller for performing the frequency measurement by measuring samples of the initiation signal at predetermined intervals throughout a predetermined period, and performing a Fast Fourier Transform on the samples to calculate a spectral distribution of signal magnitudes, each signal magnitude associated with a frequency. The base communication unit further comprises a base frequency reference coupled to the signal processor for providing a timing signal thereto, and the base frequency reference is substantially more accurate than the portable frequency reference.

Another aspect of the present invention is a portable communication unit for performing closed loop frequency control in a two-way radio communication system including a base communication unit having a base frequency reference and further including the portable communication unit, and having a portable-to-base initiation channel assigned to a predetermined frequency. The portable communication unit comprises a transmitter for transmitting an initiation signal to the base communication unit on the portable-to-base initiation channel, the initiation signal having a predetermined output power and operating on an initiation frequency of approximately the predetermined frequency; and a portable frequency reference coupled to the transmitter for providing a timing signal thereto. The portable frequency reference is substantially less accurate than the base frequency reference. The portable communication unit further comprises a frequency recalibration element coupled to the transmitter and to the portable frequency reference for recalibrating the initiation frequency by modulating the timing signal in response to a frequency correction factor communicated from the base communication unit; and a processor coupled to the frequency recalibration element for controlling the frequency recalibration element. The portable communication unit further comprises a receiver coupled to the processor for receiving the frequency correction factor from the base communication unit on a base-to-portable channel different from the portable-to-base initiation channel. The two-way radio communication system includes a portable-to-base data channel assigned to a carrier frequency having a designated offset from the predetermined frequency assigned to the portable-to-base initiation channel. The portable communication unit further comprises a frequency offset element coupled to the processor for controlling the transmitter to generate the carrier frequency of the portable-to-base data channel by applying the designated offset to the initiation frequency subsequent to frequency recalibration in accordance with a data channel allocation instruction communicated from the base communication unit on the base-to-portable channel.

DESCRIPTION OF THE PREFERRED EMBODIMENT

Figure 1:
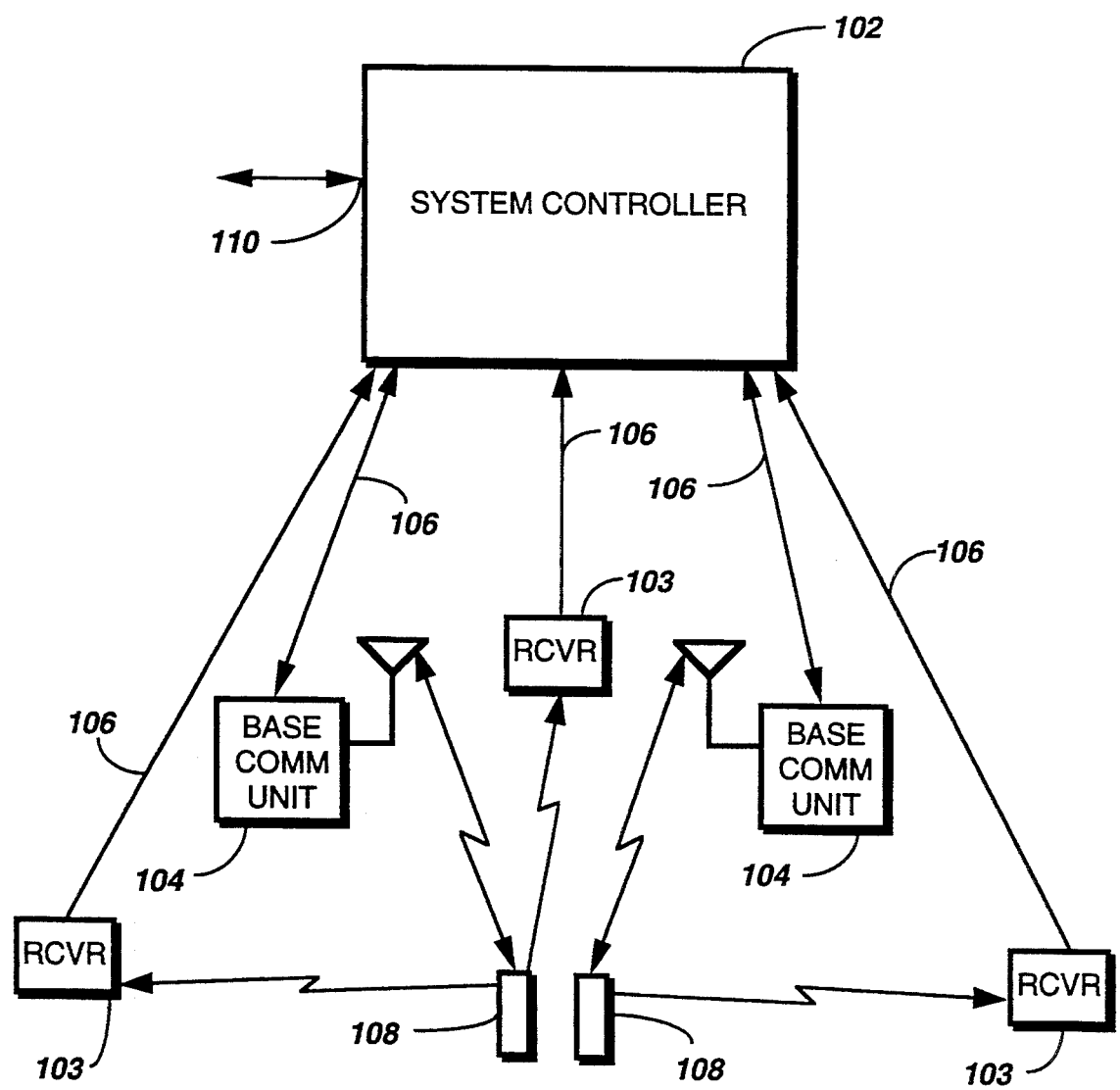
FIG. 1 is an electrical block diagram of a two-way radio communication system in accordance with the preferred embodiment of the present invention.

Referring to FIG. 1, an electrical block diagram of a two-way radio communication system 100 in accordance with the preferred embodiment of the present invention comprises a system controller 102 for formatting selective call messages and controlling the transmission thereof. The system controller 102 has at least one telephone port 110 for interfacing with the Public Switched Telephone Network in a manner well known in the art. The system controller 102 is coupled, preferably by telephone lines 106, to base communication units 104 for controlling and communicating with the base communication units 104. Also, there are preferably fill-in receivers 103 coupled by the telephone lines 106 to the system controller 102. It will be appreciated that radio links can be used as well to couple the system controller 102 with the base communication units 104 and the fill-in receivers 103. The base communication units 104 are coupled by radio links with portable communication units 108 for sending and receiving information to and from the portable communication units 108. Preferably, the paging controller 102 is similar to a model E09PED0552 PageBridge® paging terminal manufactured by Motorola, Inc. of Schaumburg, Ill. The base communication units 104 and the portable communication units 108 will be described in detail herein below.

During a typical operation of the two-way radio communication system 100 a caller places a telephone call to the telephone input 110 and identifies a portable communication unit 108 to be signaled. If the caller is using a suitable input device, e.g., a tone dialing telephone or an alphanumeric page entry device, an optional message may be entered as well. The system controller 102 then formats information comprising the selective call address of the portable communication unit 108 and, optionally, the message, and then forwards the information to the base communication units 104 in a manner well known in the art. The base communication units then simultaneously transmit the information to the portable communication units 108 using a well-known paging protocol, such as the Golay Sequential Code on a base-to-portable paging channel. In response to one of the portable communication units 108 receiving the selective call address and finding that the selective call address matches an address pre-programmed therein, the portable communication unit 108 alerts the user and displays the message, if any. Because the system 100 is a two-way communication system, the user of the portable communication unit 108 can respond to the caller, e.g., to confirm receipt of the call or even to respond with a brief return message.

It is additionally possible for the portable communication unit 108 to initiate a brief data transaction in the absence of any incoming call for the portable communication unit 108. Such portable-initiated calls can be used, for example, to register a "roaming" portable unit to a visited communication system, or to place a data call to a database to request an information download.

Figure 2:
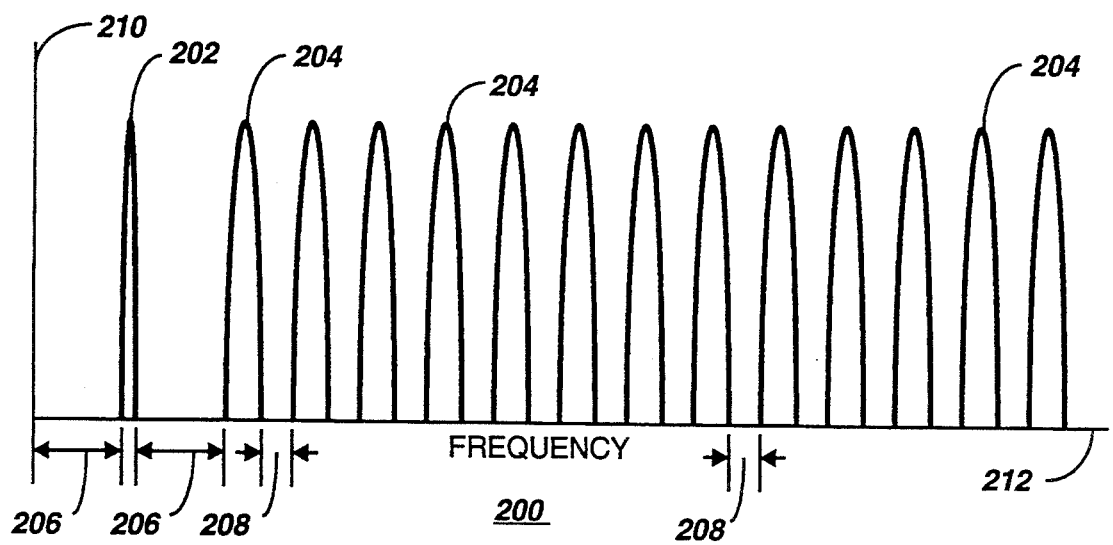
FIG. 2 is a frequency diagram depicting an arrangement of portable-to-base communication channels in the two-way radio communication system in accordance with the preferred embodiment of the present invention.

Referring to FIG. 2, a frequency diagram depicts an arrangement 200 of portable-to-base communication channels in the two-way radio communication system 100 in accordance with the preferred embodiment of the present invention. In the arrangement 200, amplitude of spectral energy is shown on the vertical axis 210, while the horizontal axis 212 represents frequency. The figure shows a single portable-to-base initiation channel 202 and a plurality of portable-to-base data channels 204. It will be appreciated that other similar arrangements of portable-to-base communication channels, e.g., more than one initiation channel, can be used as well.

Modulation utilized on the initiation channel 202 preferably is Amplitude Shift Keyed (ASK) modulation (on/off carrier), having pulse shaping such that the initiation channel 202 requires minimal bandwidth. Modulation utilized on the data channels 204 preferably is Frequency Shift Keyed (FSK) modulation, allowing data to be transmitted at a low rate commensurate with the relatively narrow bandwidth desired for the data channels 204. Each of the channels 202, 204 shown in FIG. 2 is depicted as being centered on a predetermined carrier frequency corresponding to the channel 202, 204. Each of the data channels 204 thus is assigned to a carrier frequency having a designated offset from the predetermined frequency of the initiation channel 202.

The initiation channel 202 is surrounded by first guard bands 206 sufficiently wide to accommodate a range of initiation frequencies that can be transmitted by the portable communication unit 108 utilizing a portable frequency reference 432 (FIG. 4) contained therein without closed loop recalibration of the portable frequency reference 432. There can be substantial frequency variation from one portable communication unit 108 to the next for transmissions on the initiation channel, thus requiring the first guard bands 206 to be relatively large.

Each of the data channels 204 is surrounded by second guard bands 208. The second guard bands 208 are allowed to be substantially narrower than the first guard bands 206 by virtue of the fact that the transmission frequency of the portable communication unit 108 is recalibrated by the base communication unit 104 prior to a transmission on one of the data channels 204. The base communication unit 104 operates from a base frequency reference 318 (FIG. 3), which is substantially more accurate than the portable frequency reference 432. Once the transmission frequency of the portable communication unit 108 has been recalibrated by the substantially more accurate base frequency reference 318, the carrier frequency used by the portable communication unit 108 for transmissions on the data channel 204 is held within relatively tight tolerances, thus allowing the second guard bands 208 to be relatively narrow without causing overlap among the data channels 204.

The channel arrangement and system operation described above advantageously permit the use of a less accurate—and thus substantially less expensive—frequency reference in the portable communication unit 108, while still retaining the narrow data channel guard bands and the high spectrum efficiency resulting therefrom. The base communication unit 104 requires a highly accurate, high-cost frequency reference, but the cost is spread across the typically high numbers, e.g., hundreds or thousands, of portable communication units 108 served by each base communication unit 104 of the wireless communication system 100. A high-cost frequency reference in the base communication unit 104 is of little significance to total system cost, while the cost savings from using a less accurate frequency reference in every portable communication unit 108 is very significant.

Base-to-portable communication channels are not depicted in FIG. 2, but preferably exist in another range of spectrum different from that used for portable-to-base communications. The base-to-portable communications preferably are performed on conventional high-power paging channels in a manner well known in the art. It will be appreciated that with slight additional system complexity, base-to-portable communications can alternatively utilize the same spectrum as that utilized for portable-to-base communications by sharing the spectrum on a time-division-multiplex basis.

Figure 3:
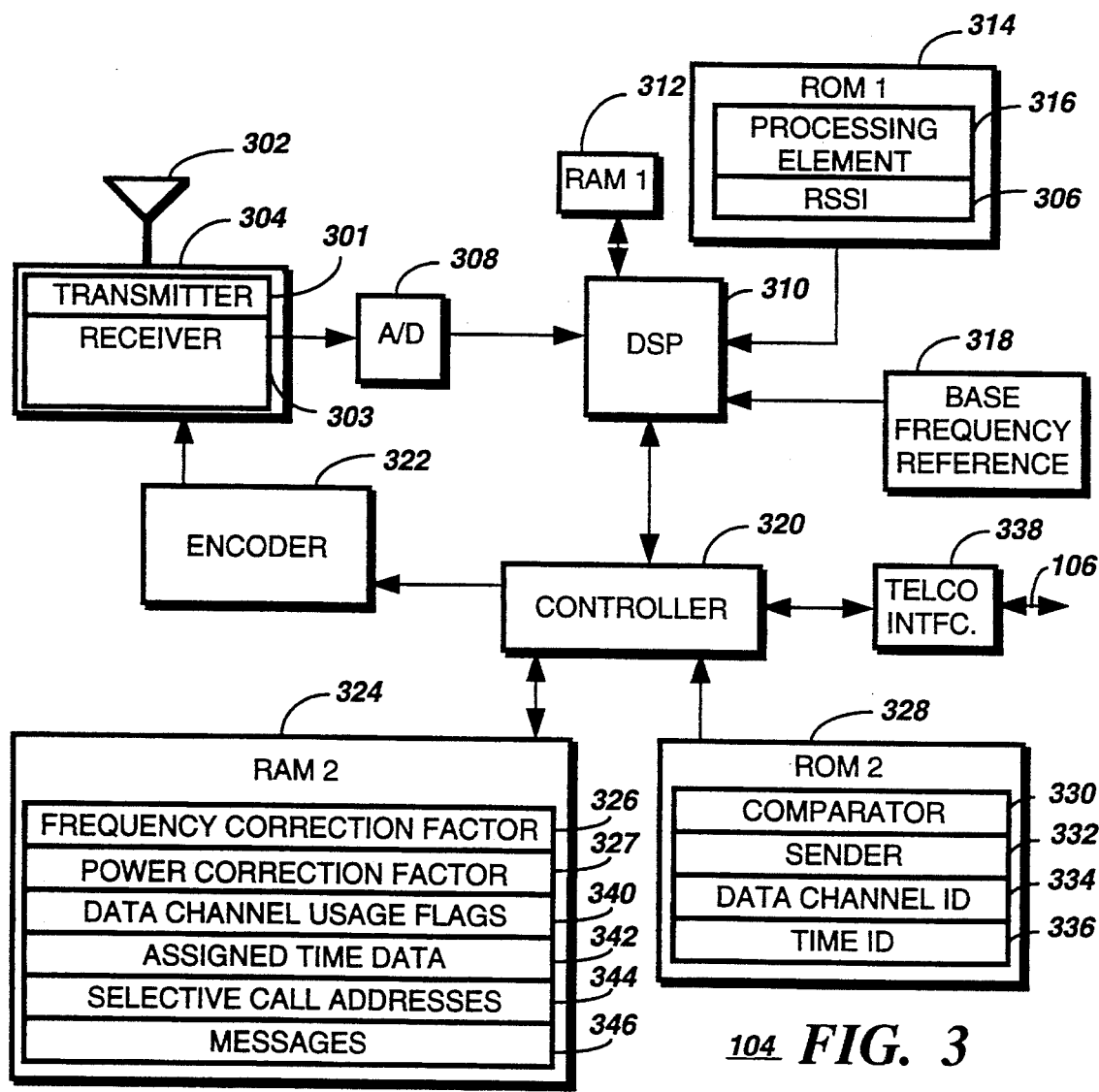
FIG. 3 is an electrical block diagram of a base communication unit used in the two-way radio communication system in accordance with the preferred embodiment of the present invention.

Referring to FIG. 3, an electrical block diagram of the base communication unit 104 used in the two-way radio communication system 100 in accordance with the preferred embodiment of the present invention comprises an antenna 302 for sending radio signals to and intercepting radio signals from the portable communication unit 108. A radio frequency (RF) package 304 coupled to the antenna 302 comprises a transmitter 301 for transmitting the radio signals, and a receiver 303 for receiving the radio signals. Preferably, the transmitter 301 is similar to a model C73 PURC 5000 ® transmitter manufactured by Motorola, Inc. of Schaumburg, Ill. The receiver 303 preferably is a conventional double-conversion RF receiver having a linear bandpass sufficiently wide to pass the initiation channel 202 and all the data channels 204, e.g., a bandpass of twenty-five KHz.

An output of the receiver 303 is coupled through a conventional analog-to-digital (A/D) converter 308 to a digital signal processor (DSP) 310 for analyzing the received signal. Preferably the DSP 310 is the DSP56000 digital signal processor manufactured by Motorola, Inc. of Schaumburg, Ill. The DSP 310 is coupled to a first random access memory (RAM) 312 for interworking with the DSP 310. The DSP 310 is further coupled to a read-only memory (ROM) 314 containing firmware to support processing requirements of the DSP 310, including a processing element 316 for determining a frequency correction factor for the portable communication unit 108, and a received signal strength indicator (RSSI) element 306 for enabling the DSP 310 to measure the power of a received signal on the initiation channel 202. The DSP 310 is also coupled to a base frequency reference 318, comprising a conventional precision crystal oscillator for providing precision timing to the DSP 310 for determining the frequency correction factor. It will be appreciated that other functionally equivalent equipment may be used as well to construct the transmitter 301, the receiver 303, the base frequency reference 318, and the DSP 310.

A controller 320 is coupled to the DSP 310 for controlling and interfacing the DSP 310. The controller 320 is preferably an MC68HC11-type microcontroller manufactured by Motorola, Inc. of Schaumburg, Ill. It will be appreciated that other functionally equivalent controllers may be used as well. The controller 320 is coupled through an encoder 322 to the RF package 304 for encoding data transmitted to the portable communication unit 108. In addition, the controller 320 is coupled to a second RAM 324 for storing operating variables, including the frequency correction factor 326, a power correction factor 327, data channel usage flags 340, assigned time data 342, selective call addresses 344, and messages 346. The operating variables 326, 327, 340, and 342 are determined internal to the base communication unit 104 in accordance with the preferred embodiment of the present invention. The selective call addresses 344 and the messages 346 optionally accompanying the selective call addresses 344 are received from the system controller 102 and stored as received for use when transmitting pages to the portable communication units 108.

The controller 320 is also coupled to a second ROM 328 containing firmware elements, comprising a comparator element 330 for comparing the power measured by the DSP 310 with a reference power level to derive the power correction factor 327. The firmware elements further comprise a sender element 332 for sending the derived power correction factor 327 to the corresponding portable communication unit 108. The firmware elements also include a data channel identification element 334 for identifying to the portable communication unit 108 a portable-to-base data channel 204 to be used by the portable communication unit 108 after frequency recalibration by the base communication unit 104. Additionally, the firmware elements comprise a time identification element 336 for identifying to the portable communication unit 108 a time for the portable communication unit 108 to use when transmitting on one of the portable-to-base data channels 204. The controller 320 is also coupled through a telephone company (TELCO) interface 338 to the telephone line 106 for communicating with the system controller 102.

It will be appreciated that the first and second RAMs 312, 324, the first and second ROMs 314, 328, the DSP 310, the A/D converter 308, the encoder/decoder 322, and the controller 320 may be integrated as one or more contiguous integrated circuits as well. It will be further appreciated that programmable ROM (PROM), electrically erasable PROM (EEPROM), electrically alterable ROM (EAROM), and other similar forms of non-volatile memory may be substituted as well for the first and second ROMs 314, 328.

Preferably, the fill-in receiver 103 (FIG. 1) comprises hardware ant software similar to that of the base communication unit 104, except for the transmitter 301, which is omitted from the fill-in receiver 103. This structure allows the fill-in receiver 103 to perform the same types of measurements for calculating the same types of correction factor information as that calculated by the base communication unit 104. Then, the fill-in receiver 103 communicates the information to the system controller 102 over the telephone lines 106. The system controller 102 then passes the information to a nearby base communication unit 104 for transmission to the portable communication unit 108.

Figure 4:
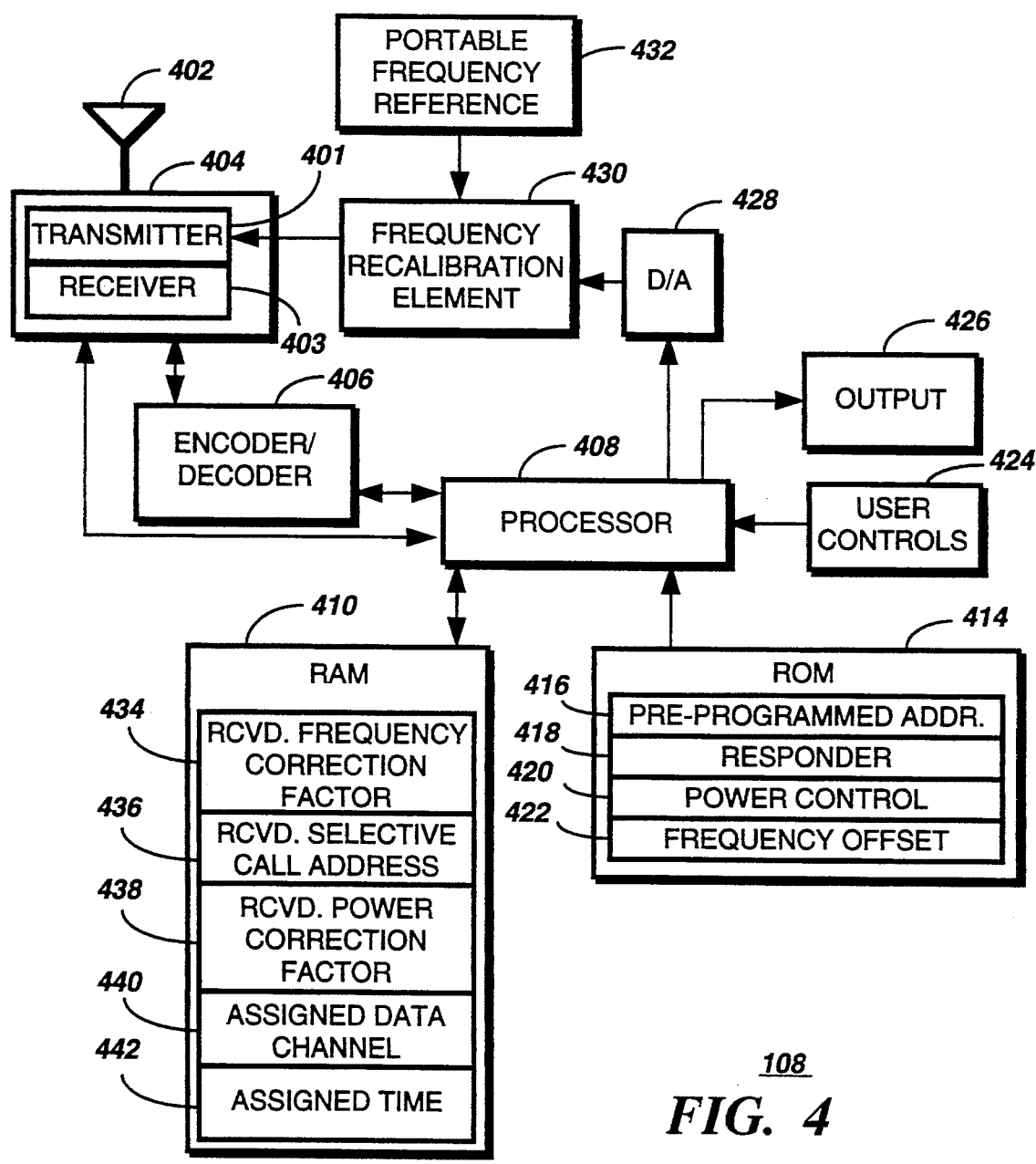
FIG. 4 is an electrical block diagram of a portable communication unit used in the two-way radio communication system in accordance with the preferred embodiment of the present invention.

Referring to FIG. 4, an electrical block diagram of the portable communication unit 108 used in the two-way radio communication system 100 in accordance with the preferred embodiment of the present invention comprises an antenna 402 for sending radio signals to and intercepting radio signals from the base communication unit 104. A radio frequency (RF) package 404 coupled to the antenna 402 comprises a transmitter 401 for transmitting the radio signals, and a receiver 403 for receiving the radio signals. Preferably, the transmitter 401 is a conventional low-power, narrowband, binary FSK transmitter, and the receiver 403 is similar to the receiver used in the model A03KLB5962CA ADVISOR® pager manufactured by Motorola, Inc. of Schaumburg, Ill.

An encoder/decoder 406 is coupled to the RF package 404 for encoding and decoding data transmitted to and received from the portable communication unit 108 in any of a number of well-known signaling protocols. The encoder/decoder 406 is coupled to a processor 408 for processing the data decoded by the encoder/decoder 406 and for sending data to the encoder/decoder 406 for encoding for transmission by the transmitter 401. The processor 408 is preferably one of the MC68HC05C8 or C11 series microcomputers manufactured by Motorola, Inc. of Schaumburg, Ill. The processor 408 is further directly coupled to the RF package 404 for providing control signals thereto. The processor 408 is also coupled to a RAM 410 for storing operating variables used by the processor 408. The operating variables comprise a received frequency correction factor 434, a received selective call address 436, a received power correction factor 438, an assigned data channel 440, and an assigned time 442. The operating variables 434, 436, 438, 440, 442 are received in a transmission from the base communication unit 104 after an initial transmission of carrier from the portable communication unit 108.

The processor 408 is also coupled to a ROM 414 containing firmware elements used by the processor 408. The firmware elements comprise a pre-programmed selective call address 416 to which the portable communication unit 108 is responsive. The firmware elements also include a responder element 418 for activating the transmitter 401 to transmit an initiation signal comprising a burst of unmodulated carrier in response to the received selective call address 436 matching the pre-programmed selective call address 416.

The firmware elements further comprise a power control element 420 for controlling the output power of the transmitter 401 in response to the received power correction factor 438 received from the base communication unit 106. Additionally, the firmware elements include a frequency offset element 422 for controlling the transmitter 401 to generate a recalibrated carrier frequency in accordance with the assigned data channel 440 and the received frequency correction factor 434, during a time corresponding to the assigned time 442. This is done by applying a designated offset corresponding to the assigned data channel 440 to the frequency of the initiation signal after recalibration by the base communication unit 104.

The processor 408 is also coupled to user controls 424, e.g., well-known buttons and knobs, for providing data input and control of the portable communication unit 108 by a user. In addition, the processor 408 is coupled to an output element 426, such as an audible or tactile alert, and (optionally) a display for indicating receipt of a call and displaying a message, respectively. The processor is further coupled through a conventional digital-to-analog (D/A) converter 428 to a frequency recalibration element 430 for controlling and recalibrating the carrier frequency of the transmitter 401 in response to instructions from the base communication unit 104. The frequency recalibration element 430 comprises a conventional frequency synthesizer combined with a conventional DC-capable modulator for adjusting the operating frequency of the synthesizer, such as taught by U.S. Pat. No. 4,471,328, granted Sep. 11, 1984, to Chapman, which patent is hereby incorporated herein by reference. The frequency recalibration element 430 is coupled to a portable frequency reference 432, such as a crystal oscillator, for providing a basic timing reference for the synthesizer. The output of the frequency recalibration element 430 is coupled to the transmitter 401 for providing a signal that determines the carrier frequency of the transmitter.

It will be appreciated that PROM, EEPROM, EAROM, and other similar forms of non-volatile memory may be substituted as well for the ROM 414. It will be further appreciated that the RAM 410, the ROM 414, the D/A converter 428, the encoder/decoder 406, and the processor 408 may be integrated as one or more contiguous integrated circuits as well.

Figure 5:
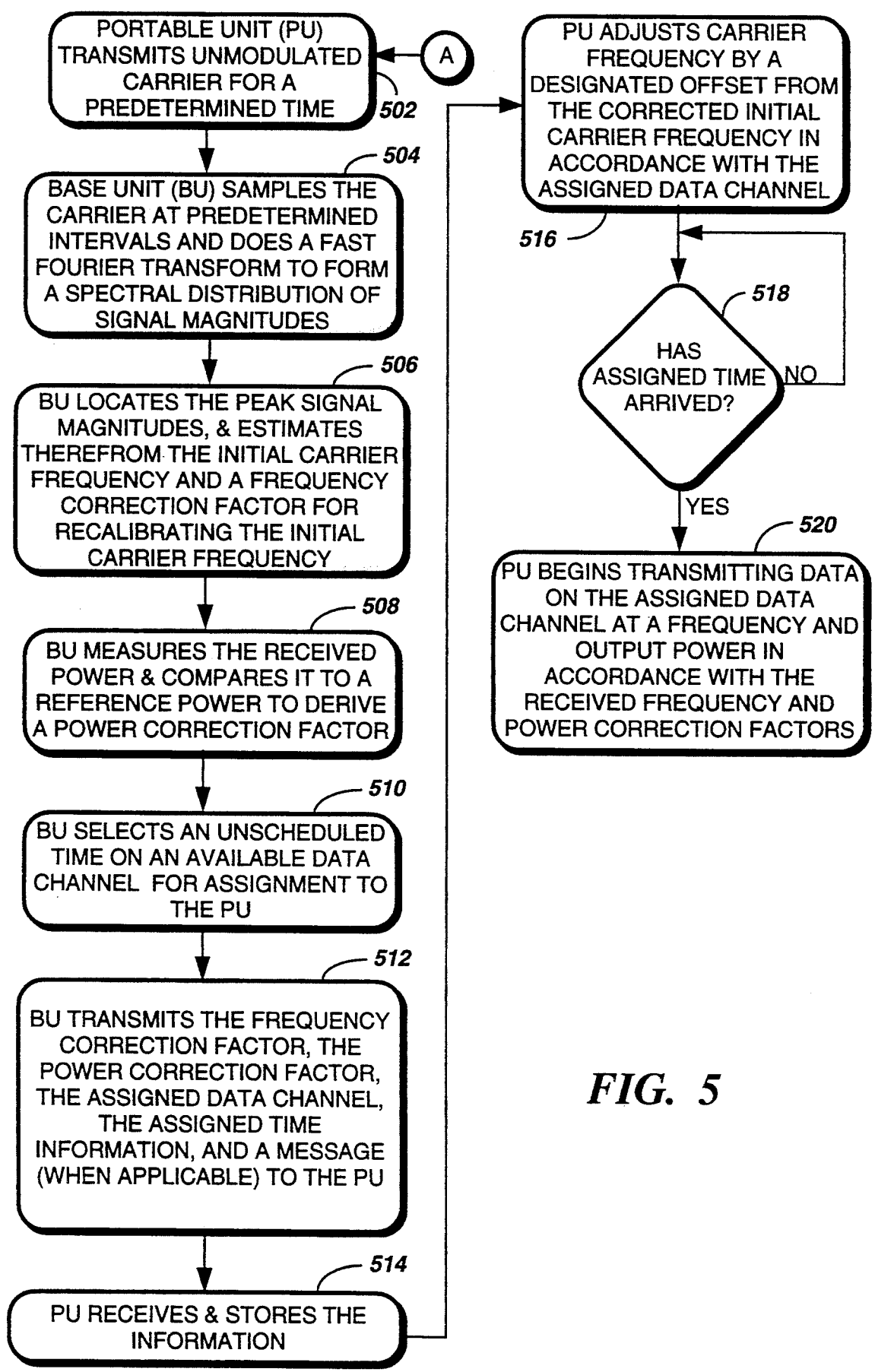
FIG. 5 is a flow chart of the operation of the two-way radio communication system during portable-initiated calls in accordance with the preferred embodiment of the present invention.

Referring to FIG. 5, a flow chart of the operation of the two-way radio communication system 100 during portable-initiated calls in accordance with the preferred embodiment of the present invention begins with the processor 408 of the portable communication unit 108 controlling the transmitter 401 to transmit 502 unmodulated carrier signal for a predetermined time. Upon receipt of the unmodulated carrier signal, the controller 320 of the base communication unit 104 controls the DSP 310 to sample 504 the signal at predetermined intervals precisely timed by the base frequency reference 318, and to perform a Fast Fourier Transform on the samples to form a spectral distribution of signal magnitudes. Next, under control of the processing element 316 the DSP 310 locates 506 the peak signal magnitudes and performs a weighted average of the frequencies associated with each magnitude to estimate the frequency of the carrier signal, and therefrom to determine the frequency correction factor 326 for recalibrating the carrier frequency of the portable communication unit 108. The controller 320 then temporarily stores the frequency correction factor 326 in the location therefor in the second RAM 324.

In addition, the controller 320 notes 508 the received power level measured by the DSP 310 and computes therefrom the power correction factor 327, which the controller 320 then temporarily stores in the location therefor in the second RAM 324. Next, the controller 320 accesses the data channel usage flags 340 and the assigned time data 342 to select 510 an available data channel and time, which the controller 320 then assigns for the portable communication unit 108. The controller 320 then controls the encoder/decoder 322 and the transmitter 301 to encode and transmit 512 the frequency correction factor 326, the power correction factor 327, the assigned data channel, the assigned time information, and a message (when applicable) to the portable communication unit 108. A message is typically sent at this point during base-initiated calls, which also perform the steps of FIG. 5, as will be described herein below.

When the portable communication unit 108 receives the information, the processor 408 of the portable communication unit 108 stores 514 the information in the appropriate locations therefor in the RAM 410. Next, the processor 408 accesses the frequency offset element 422 to control the frequency recalibration element 430 through the D/A converter 428 to adjust 516 the carrier frequency in accordance with the received frequency correction factor 434 and the assigned data channel 440. The processor 408 also accesses the power control element 420 to control the transmitter 401 to adjust the output power thereof in accordance with the received power correction factor 438, and then waits 518 for the assigned time to arrive. When the assigned time arrives, the processor 408 controls 520 the encoder/decoder 406 and the transmitter 401 to begin transmission of data, e.g., the pre-programmed address 416 of the portable communication unit 108, on the recalibrated assigned data channel frequency at the correct output power.

Thus, the present invention advantageously maintains both frequency accuracy and output power control on the portable-to-base data channels 204, while permitting the use of a less accurate, less expensive frequency reference in the portable communication unit 108 than is required for the base communication unit 104. By performing a closed loop frequency control, frequency accuracy is less affected by extraneous influences, such as Doppler shift, than is the case in conventional open-loop frequency control systems.

Figure 6:
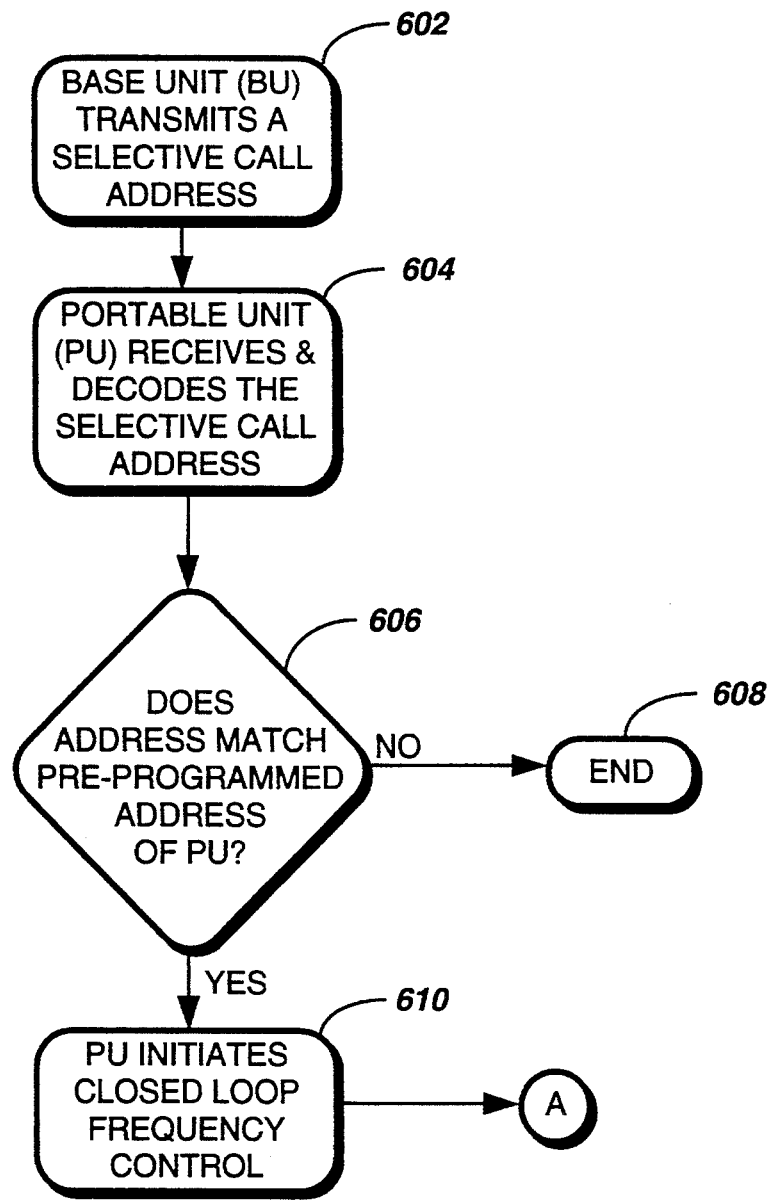
FIG. 6 is a flow chart of the operation of the two-way radio communication system during base-initiated calls in accordance with the preferred embodiment of the present invention.

Referring to FIG. 6, a flow chart of the operation of the two-way radio communication system during base-initiated calls in accordance with the preferred embodiment of the present invention begins with the base communication unit 104 transmitting 602 a selective call address. When the receiver 403 of the portable communication unit 108 receives the selective call address, the encoder/decoder 406 decodes 604 the address, after which the processor 408 accesses the pre-programmed address 416 assigned to the portable communication unit 108 to determine 606 whether the received address matches the pre-programmed address 416. If not, the process ends 608. If the addresses do match, the portable communication unit 108 accesses the responder element 418 to initiate 610 closed loop frequency control by executing the steps of the flow chart of FIG. 5, as described herein above.

Figure 7:
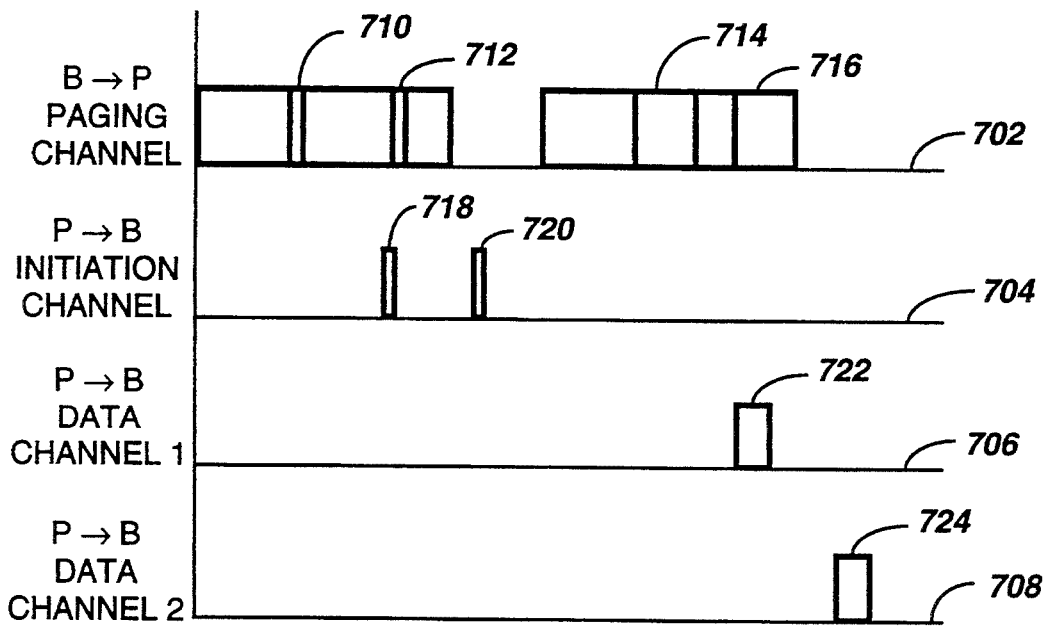
FIG. 7 is a timing diagram of a base-originated call in accordance with the preferred embodiment of the present invention.

Referring to FIG. 7, a timing diagram 700 of a base-originated call in accordance with the preferred embodiment of the present invention depicts a base-to-portable paging channel timeline 702, a portable-to-base initiation channel timeline 704, a first portable-to-base data channel timeline 706, and a second portable-to-base data channel timeline 708. The timing diagram 700 begins with the base communication unit 104 sending a first page 710 to a first portable communication unit 108, followed by a second page 712 to a second portable communication unit 108. The first and second pages 710, 712 each have a position in a sequence of pages sent. In response, the first portable communication unit 108 sends a first burst of carrier 718 on the initiation channel 202, and the second portable communication unit 108 sends a second burst of carrier 720 on the initiation channel 202. For identification purposes, the timing of the first and second bursts of carrier 718, 720 preferably is determined at least in part by the position of the first and second pages 710, 712 in the sequence of pages sent, in a manner similar to that disclosed in U.S. Pat. No. 5,124,697 to Moore, granted Jun. 23, 1992, entitled "Acknowledge-Back Pager," which is hereby incorporated herein by reference.

After the base communication unit 104 (or the fill-in receiver 103) receives and identifies the first and second carrier bursts 718, 720 the base communication unit 104 (or the fill-in receiver 103) then determines frequency and power correction factors, and assigns a data channel 204 and a transmission time for use by each of the first and second portable communication units 108. The information concerning the frequency and power correction factors, the assigned data channel 204, and the transmission time is transmitted on the paging channel to the first and second portable communication units 108 in first and second instructional pages 714, 716 for each. The first and second instructional pages 714, 716 preferably also include any message information intended for the first and second portable communication units 108. In response, the first and second portable communication units 108 recalibrate their respective carrier frequencies, adjust their respective output powers, and go to their respective data channels 204, where they begin data transmission 722, 724 at their respective assigned times, in accordance with the first and second instructional pages 714, 716.

Figure 8:
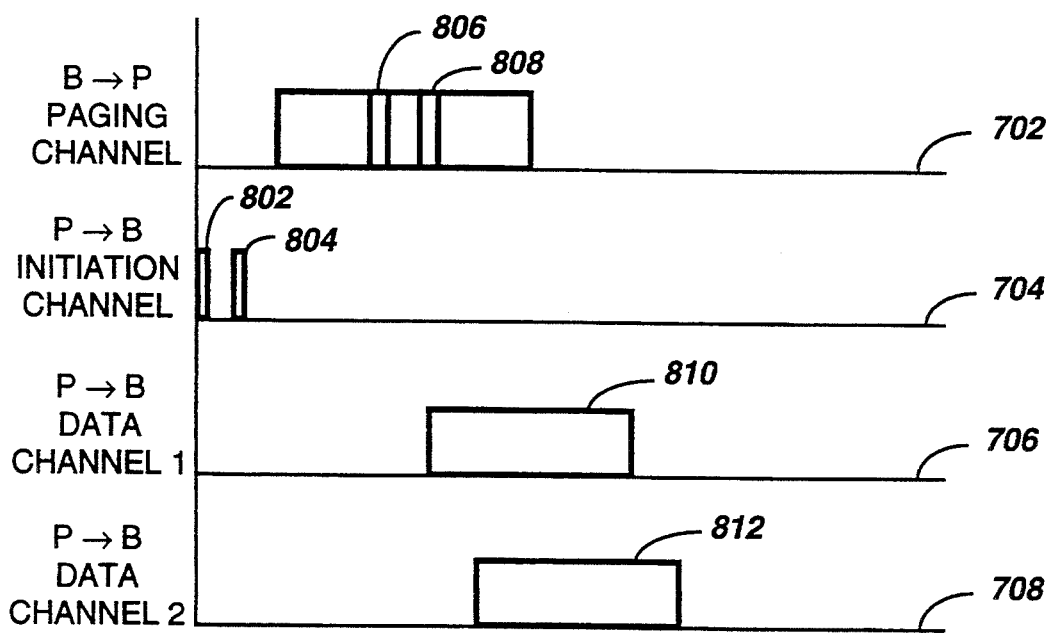
FIG. 8 is a timing diagram of a portable-originated call in accordance with the preferred embodiment of the present invention.

Referring to FIG. 8, a timing diagram 800 of a portable-originated call in accordance with the preferred embodiment of the present invention begins with a first portable communication unit 108 transmitting a first burst of carrier in a first time-slot position on the initiation channel 202, followed by a second portable communication unit 108 transmitting a second burst of carrier in a second time-slot position on the initiation channel 202. In response, the base communication unit 104 determines frequency and power correction factors, and assigns a data channel 204 and a transmission time for use by each of the first and second portable communication units 108.

The information concerning the frequency and power correction factors, the assigned data channel 204, and the transmission time is transmitted on the paging channel to the first and second portable communication units 108 in first and second instructional pages 806, 808 for each. For identification purposes, the base communication unit 104 preferably uses the first and second time-slot positions as addresses for responding to the first and second portable communication units, in a manner similar to that disclosed in U.S. patent application Ser. No. 07/724,017, filed Jul. 1, 1991, by Jasinski, entitled "Method and Apparatus for Initiating Communication on an Assigned Frequency," which is hereby incorporated herein by reference.

In response to the first and second instructional pages 806, 808, the first and second portable communication units 108 recalibrate their respective carrier frequencies, adjust their respective output powers, and go to their respective data channels 204, where they begin data transmission 810, 812 at their respective assigned times, in accordance with the first and second instructional pages 806, 808.

Thus, the present invention advantageously provides a method and apparatus for closed loop control of the carrier frequency off a narrowband portable-to-base channel. The present invention provides a reliable approach for controlling the carrier frequency that does not substantially increase the size, cost, or power consumption of the portable unit.

What is claimed is:

1. A method of closed loop frequency control in a two-way radio communication system including a base communication unit and a portable communication unit and having a portable-to-base initiation channel assigned to a predetermined frequency, the method comprising the steps of:

transmitting on the portable-to-base initiation channel a signal from the portable communication unit to the base communication unit, the signal having a predetermined output power and operating on an initiation frequency of approximately the predetermined frequency;

receiving the signal in the base communication unit;

determining a frequency correction factor by performing a frequency measurement on the signal received in the base communication unit, the frequency correction factor for recalibrating the initiation frequency in accordance with the predetermined frequency;

communicating the determined frequency correction factor from the base communication unit to the portable communication unit on a base-to-portable channel different from the portable-to-base initiation channel; and recalibrating the initiation frequency in the portable communication unit in response to the communicated frequency correction factor by modulating a reference frequency that determines the initiation frequency, said modulating performed in accordance with the frequency correction factor communicated, wherein the two-way radio communication system has a portable-to-base data channel assigned to a carrier frequency having a designated offset from the predetermined frequency assigned to the portable-to-base initiation channel, and wherein the method further comprises the step of generating in the portable communication unit the carrier frequency of the portable-to-base data channel subsequent to said recalibrating step by applying the designated offset to the recalibrated initiation frequency in accordance with a data channel allocation instruction communicated from the base communication unit on the base-to-portable channel.

2. The method according to claim 1, wherein said transmitting step comprises the step of sending an unmodulated carrier signal for a predetermined duration.

3. The method according to claim 1, further comprising the steps of:

receiving by the portable communication unit a selective call address sent from the base communication unit on said base-to-portable channel prior to said transmitting step, the selective call address matching a selective call address pre-programmed within the portable communication unit; and performing said transmitting step in response thereto.

4. The method according to claim 1, further comprising the steps of:

measuring received power at the base communication unit of the signal transmitted during said transmitting step;

comparing the measured received power with a reference power level to derive a power correction factor;

sending the derived power correction factor from the base communication unit to the portable communication unit; and adjusting output power of the portable communication unit in response thereto.

5. The method according to claim 1, further comprising in the base communication unit the step of identifying to the portable communication unit a time for the portable communication unit to use when transmitting on the portable-to-base data channel.

6. The method according to claim 1, wherein said determining step comprises the steps of:

sampling the signal received at predetermined intervals throughout a predetermined period to produce a sampled received signal;

performing a Fast Fourier Transform on the sampled received signal to calculate a spectral distribution of signal magnitudes, each signal magnitude corresponding to a frequency;

examining the spectral distribution of signal magnitudes to locate a peak signal magnitude therein;

estimating the initiation frequency to be the frequency corresponding to the peak signal magnitude; and comparing the predetermined frequency with the initiation frequency estimated, to determine the frequency correction factor.

7. The method according to claim 1, wherein the portable communication unit includes a portable frequency reference, and the base communication unit includes a base frequency reference, and wherein the portable-to-base initiation channel includes guard bands sufficiently wide to accommodate a range of initiation frequencies that can be transmitted by the portable communication unit utilizing the portable frequency reference without closed loop recalibration, and wherein the base frequency reference is substantially more accurate than the portable frequency reference, thereby allowing the guard bands of the portable-to-base data channel to be substantially narrower than the guard bands of the portable-to-base initiation channel.

8. A base communication unit for performing closed loop frequency control in a two-way radio communication system including the base communication unit and a portable communication unit having a portable frequency reference and utilizing a portable-to-base initiation channel assigned to a predetermined frequency, the base communication unit comprising:

a receiver for receiving an initiation signal from the portable communication unit on the portable-to-base initiation channel, the initiation signal having a predetermined output power and operating on an initiation frequency of approximately the predetermined frequency;

a controller coupled to said receiver for determining from the initiation signal a frequency correction factor for recalibrating the initiation frequency, said frequency correction factor determined from a frequency measurement on the initiation signal received;

a transmitter coupled to said controller for communicating the frequency correction factor to the portable communication unit on a base-to-portable channel different from the portable-to-base initiation channel;

a signal processor coupled to said receiver and coupled to said controller for performing said frequency measurement by measuring samples of the initiation signal at predetermined intervals throughout a predetermined period, and performing a Fast Fourier Transform on the samples to calculate a spectral distribution of signal magnitudes, wherein each signal magnitude is associated with a frequency; and a base frequency reference coupled to said signal processor for providing a timing signal thereto, wherein the base frequency reference is substantially more accurate than the portable frequency reference.

9. The base communication unit according to claim 8, further comprising:

a power measuring element coupled to said receiver for measuring power of the initiation signal;

a comparator element coupled to said power measuring element for comparing the power measured thereby with a reference power level to derive a power correction factor; and a sender element coupled to said comparator element for controlling the transmitter to send the power correction factor to the portable communication unit.

10. The base communication unit according to claim 8, further comprising a data channel identification element coupled to said controller for identifying to the portable communication unit a portable-to-base data channel to be used by the portable communication unit after recalibration.

11. The base communication unit according to claim 8, further comprising a time identification element coupled to said controller for identifying to the portable communication unit a time for the portable communication unit to use when transmitting on a portable-to-base data channel.

12. The base communication unit according to claim 8, further comprising an analog to digital converter coupled to the receiver for sampling the initiation signal received at the predetermined intervals throughout the predetermined period to produce a sampled received signal, and wherein the base communication unit further comprises a processing element coupled to said signal processor for examining the spectral distribution of signal magnitudes to locate a peak signal magnitude therein, for estimating the initiation frequency to be the frequency corresponding to the peak signal magnitude, and for comparing the predetermined frequency with the initiation frequency to determine the frequency correction factor.

13. A portable communication unit for performing closed loop frequency control in a two-way radio communication system including a base communication unit having a base frequency reference and further including the portable communication unit, and having a portable-to-base initiation channel assigned to a predetermined frequency, the portable communication unit comprising:

a transmitter for transmitting an initiation signal to the base communication unit on the portable-to-base initiation channel, the initiation signal having a predetermined output power and operating on an initiation frequency of approximately the predetermined frequency;

a portable frequency reference coupled to said transmitter for providing a timing signal thereto, wherein the portable frequency reference is substantially less accurate than the base frequency reference;

a frequency recalibration element coupled to said transmitter and to said portable frequency reference for recalibrating the initiation frequency by modulating said timing signal in response to a frequency correction factor communicated from the base communication unit;

a processor coupled to said frequency recalibration element for controlling said frequency recalibration element; and a receiver coupled to said processor for receiving the frequency correction factor from the base communication unit on a base-to-portable channel different from the portable-to-base initiation channel, wherein the two-way radio communication system includes a portable-to-base data channel assigned to a carrier frequency having a designated offset from the predetermined frequency assigned to the portable-to-base initiation channel, and wherein the portable communication unit further comprises a frequency offset element coupled to said processor for controlling said transmitter to generate the carrier frequency of the portable-to-base data channel by applying the designated offset to the initiation frequency subsequent to frequency recalibration in accordance with a data channel allocation instruction communicated from the base communication unit on the base-to-portable channel.

14. The portable communication unit according to claim 13, wherein the initiation signal comprises an unmodulated carrier having a predetermined duration.

15. The portable communication unit according to claim 13, further comprising:
- a decoder coupled to said processor for decoding a selective call address;
- a memory coupled to said processor for storing a pre-programmed selective call address; and
- a responder element coupled to said processor for activating said transmitter to transmit the initiation signal in response to the decoded selective call address matching the pre-programmed selective call address.

16. The portable communication unit according to claim 13, further comprising a power control element coupled to said transmitter for controlling output power of the transmitter in response to a power correction factor received from the base communication unit.

* * * * *